United States Patent
Jeong

(10) Patent No.: US 8,080,737 B2
(45) Date of Patent: Dec. 20, 2011

(54) CERAMIC SUBSTRATE, METHOD OF MANUFACTURING THE SAME, AND ELECTRICAL DEVICE USING THE SAME

(75) Inventor: Seung Gyo Jeong, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 498 days.

(21) Appl. No.: 12/342,907

(22) Filed: Dec. 23, 2008

(65) Prior Publication Data

US 2009/0166073 A1    Jul. 2, 2009

(30) Foreign Application Priority Data

Dec. 27, 2007    (KR) .................. 10-2007-0139194

(51) Int. Cl.
*H05K 1/09* (2006.01)
(52) U.S. Cl. .................. 174/256; 174/250; 174/259
(58) Field of Classification Search .................. None
See application file for complete search history.

(56) References Cited

U.S. PATENT DOCUMENTS

| | | | | |
|---|---|---|---|---|
| 5,043,223 A | * | 8/1991 | Kumagai et al. | 428/432 |
| 5,740,603 A | * | 4/1998 | Kim | 29/830 |
| 5,847,326 A | * | 12/1998 | Kawakami et al. | 174/256 |
| 5,879,788 A | * | 3/1999 | Fukuta et al. | 428/210 |
| 6,284,080 B1 | * | 9/2001 | Haq et al. | 156/89.16 |
| 6,703,114 B1 | * | 3/2004 | Guiles et al. | 428/209 |
| 6,852,569 B2 | * | 2/2005 | Nakano et al. | 438/107 |
| 6,872,894 B2 | * | 3/2005 | Fuller et al. | 174/260 |
| 7,557,307 B2 | * | 7/2009 | Nishizawa et al. | 174/384 |

FOREIGN PATENT DOCUMENTS

| | | |
|---|---|---|
| JP | 2001-196427 | 7/2001 |
| JP | 3396468 | 4/2003 |
| JP | 2006-173240 | 6/2006 |
| KR | 10-0447032 | 9/2004 |
| KR | 10-0710459 B1 | 4/2007 |

OTHER PUBLICATIONS

Korean Office Action, w/ English translation thereof, issued in Korean Patent Application No. KR 10-2007-0139194 dated Apr. 28, 2010.
Korean Office Action, with English Translation, issued in Korean Patent Application No. 10-2007-0139194, dated Oct. 28, 2010.

* cited by examiner

*Primary Examiner* — Boris Chervinsky
(74) *Attorney, Agent, or Firm* — McDermott Will & Emery LLP

(57) ABSTRACT

Provided are a ceramic substrate, a method of manufacturing the same, and an electrical device using the same. A ceramic substrate includes a first laminated body, a second laminated body and an adhesive part. The first laminated body includes a predetermined electrode formed therein. The second laminated body is laminated on and electrically connected to the first laminated body. Also, the adhesive part is intervened between the first laminated body and the second laminated body to adhere the first and second laminated bodies through interfacial reaction.

11 Claims, 5 Drawing Sheets

CERAMIC SUBSTRATE, METHOD OF MANUFACTURING THE SAME, AND ELECTRICAL DEVICE USING THE SAME

CROSS-REFERENCE TO RELATED APPLICATIONS

This application claims the priority of Korean Patent Application No. 2007-0139194 filed on 27 Dec., 2007, in the Korean Intellectual Property Office, the disclosure of which is incorporated herein by reference.

BACKGROUND OF THE INVENTION

1. Field of the Invention

The present invention relates to a ceramic substrate, a method of manufacturing the same, and an electrical device using the same, and more particularly, to a composite substrate having excellent electrical properties and chemical resistance, a method of manufacturing the same, and an electrical device using the same.

2. Description of the Related Art

Generally, a ceramic laminated substrate, especially, a Low Temperature Co-fired Ceramic (LTCC) substrate, which is fired at a low temperature of about 1000° C. or less, has excellent electrical properties. Also, LTCC substrate may perform complex functions while realizing ultra-miniaturization of a device using the LTCC substrate. Accordingly, LTCC substrate has been widely used in various technical fields.

However, LTCC substrate has a low chemical resistance in spite of the excellent electrical properties. Accordingly, if used in a certain device, LTCC substrate may be melted, especially, during an etching process.

On the other hand, a High Temperature Co-fired Ceramic (HTCC) substrate, which is fired at a high temperature of about 1500° C. or more, has excellent mechanical strength and chemical resistance. However, when high temperature ceramic substrate is used in a certain device, implementations of multi-layer and precise pattern may be difficult. Also, high temperature ceramic substrate has weak electrical properties.

Therefore, development of a ceramic substrate capable of embodying a multi-layer structure and a precise pattern with excellent chemical resistance and electrical properties is required.

SUMMARY OF THE INVENTION

An aspect of the present invention provides to a composite substrate, a method of manufacturing the same, and an electrical device using the same, which has excellent electrical properties and chemical resistance or strength, and may be embodied as a multi-layer structure and a precise pattern.

According to an aspect of the present invention, there is provided a ceramic substrate including: a first laminated body having a predetermined electrode formed therein; a second laminated body laminated on and electrically connected to the first laminated body; and an adhesive part intervened between the first laminated body and the second laminated body to adhere the first and second laminated bodies through interfacial reaction.

The second laminated body may include a high temperature co-fired ceramic substrate.

The first laminated body may include a low temperature co-fired ceramic substrate formed from a predetermined ceramic laminated body through a low temperature firing together with the high temperature co-fired ceramic substrate.

The adhesive part may include a glass intervened between the ceramic laminated body and the high temperature co-fired ceramic substrate to provide a predetermined adhesion through the low temperature firing.

The high temperature co-fired ceramic substrate may include a plurality of holes, the plurality of holes being filled with an electrode material identical to an electrode material of the low temperature co-fired ceramic substrate to form an electrode, and being fired together with the ceramic laminated body.

The first laminated body may include an already-fired low temperature co-fired ceramic substrate.

The adhesive part may include a glass intervened between the high ceramic co-fired ceramic substrate and the low temper-co-fired ceramic substrate to provide adhesion through a low-temperature firing.

The high temperature co-fired ceramic substrate may include a plurality of holes, the plurality of holes being filled with a predetermined material to form an electrode.

The electrode formed in the high temperature co-fired ceramic substrate may be identical to the electrode formed in the low temperature co-fired ceramic substrate.

According to another aspect of the present invention, there is provided an electrical device including: a low temperature co-fired ceramic substrate having a predetermined electrode formed therein; a high temperature co-fire ceramic substrate provided on the outside of the low temperature co-fired ceramic substrate; an adhesive part intervened between the first laminated body and the second laminated body to adhere the first and second laminated bodies through interfacial reaction; and a working device provided on the high temperature co-fired ceramic substrate to perform a predetermined task.

The working device may include a probe device probing each chip in a silicon wafer to test the silicon wafer.

According to still another aspect of the present invention, there is provided a method of manufacturing a ceramic substrate, the method including: laminating an adhesive part on a first laminated body having a predetermined electrode therein; laminating a second laminated body on the adhesive part; and firing the first laminated body, the second laminated body, and the adhesive part.

The second laminated body may include a high temperature co-fired ceramic substrate.

The first laminated body may include an unfired ceramic laminated body, the first laminated body being adhered to the high temperature co-fired ceramic substrate by the adhesive part through the firing.

The first laminated body may include an already-fired low temperature co-fired ceramic substrate, the first laminated body being adhered to the high temperature co-fired ceramic substrate by the adhesive part through the firing.

The firing may include a low-temperature firing performed within a sintering temperature range of the low temperature co-fired ceramic substrate.

The adhesive part may include a glass sintered through the low-temperature firing, the glass providing a predetermined adhesion through interfacial reaction with the high temperature co-fired ceramic substrate and the low temperature co-fired ceramic substrate, respectively.

Prior to the firing, the method further may include forming a plurality of holes in the high temperature co-fired ceramic substrate and filling the plurality of holes with a predetermined electrode material.

The electrode material filled in the high temperature ceramic substrate may be identical to an electrode material filled in the electrode of the first laminated body.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, exemplary embodiments of the present invention will now be described in detail with reference to the accompanying drawings.

FIG. 1 is a diagram illustrating a ceramic substrate and a method of manufacturing the same according to an embodiment of the present invention. A schematic process of manufacturing a ceramic substrate according to an embodiment of the present invention is described in FIG. 1A to 1G.

The present invention basically relates a composite substrate of a high temperature co-fired ceramic (HTCC) substrate (hereinafter, referred to as a high temperature ceramic substrate) and a low temperature co-fired ceramic (LTCC) substrate (hereinafter, referred to as a low temperature ceramic substrate). FIG. 1 illustrates a method manufacturing a ceramic substrate by firing a ceramic laminated body laminated on an already-fired high temperature ceramic substrate at a low temperature.

Figure 1A:
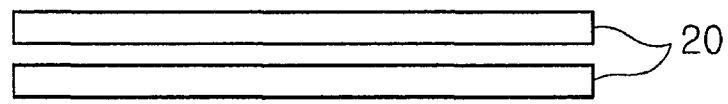
FIG. 1A through FIG. 1G are a diagram illustrating a ceramic substrate and a method of manufacturing the same according to an embodiment of the present invention.

Referring to FIG. 1A, a high temperature ceramic substrate 20 is prepared. The high temperature ceramic substrate 20 has already been fired at a high temperature. The high temperature ceramic substrate 20 may be provided through a typical HTCC process.

That is, The high temperature ceramic substrate 20 is produced by sintering a sheet formed of alumina and the like at a high temperature of about 1500° C. or more.

Figure 1B:
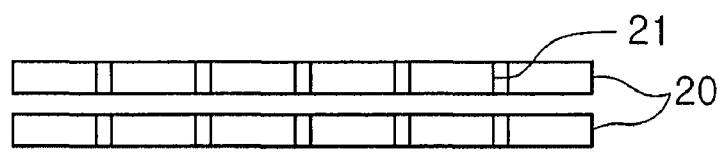

Referring to FIG. 1B, a via hole 21 is formed in the high temperature ceramic substrate 20. The via hole 21 may be formed by a laser, etc.

Figure 1C:
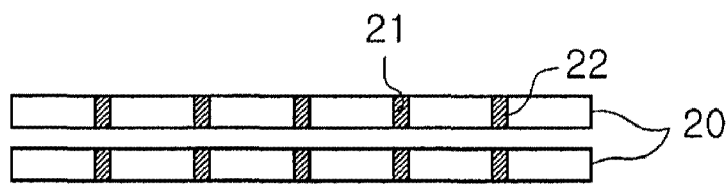

Referring to of FIG. 1C, an electrode 22 is formed by filling the via hole 21 with a conductive paste.

Compared to an electrode 11 provided in a ceramic laminated sheet 12, a ceramic laminated body 13, or a LTCC substrate 10, an electrode in the high temperature ceramic substrate 20 is referred to as a second electrode 22, and an electrode in the low temperature ceramic substrate 10 is referred to as a first electrode 11.

The second electrode 22 may be filled with a material having a substantially identical physical property to that of the first electrode 11.

That is, since fired at a high temperature, a normal high temperature ceramic substrate is formed using a heavy metal such as tungsten or molybdenum resistant to heat. However, the heavy metal such as tungsten or molybdenum is not preferable because their electrical properties are inferior to copper or argentum.

Accordingly, the electrode may be formed by filling the via hole 21 with, but not limited to, copper or argentum in FIGS. 1B and 1C.

However, as the case may be, tungsten or molybdenum may be used to form the electrode while firing the high temperature ceramic substrate in the process of manufacturing the ceramic substrate according to an embodiment of the present invention.

If the metal such as tungsten and molybdenum is used in the high temperature ceramic substrate 20, the processes as described in FIGS. 1B and 1C may be unnecessary.

Although the metal such as tungsten and molybdenum is not used, it is not necessary to equalize the second electrode 22 with the first electrode 11. The second electrode 22 may be formed of a material having similar electrical properties to a material forming the first electrode 11.

Figure 1D:
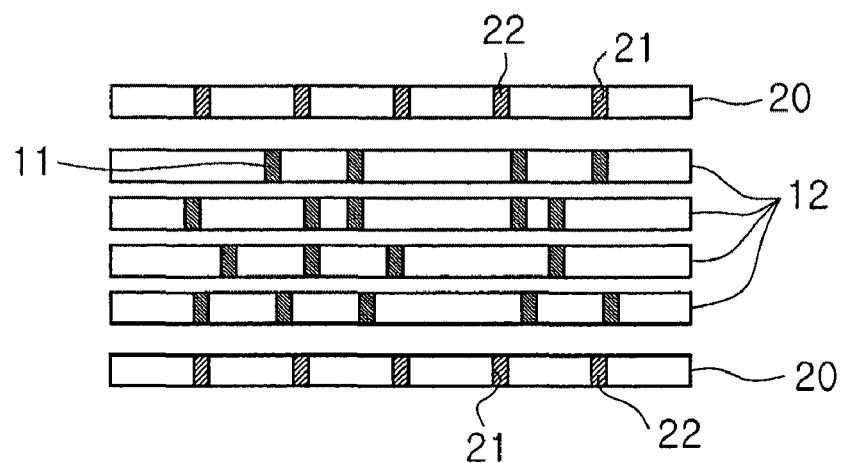

On the other hand, referring to FIG. 1D, a plurality of ceramic laminated sheets 12 are provided to form the low temperature ceramic substrate of the ceramic substrate according to an embodiment of the present invention.

Each ceramic laminated sheet 12 includes an electrode formed of copper or argentum, i.e., the first electrode 11. The plurality of ceramic laminated sheets 12 may be formed of a material, e.g., borosilicate glass, alumina, etc, which is sinterable at a low temperature.

The ceramic laminated sheet 12 may be formed through the following processes. First, a slurry is formed by mixing a ceramic powder with a solvent and a binder. The slurry is coated on a predetermined film and dried into a thin sheet shape. Then, after a via hole is formed in the thin sheet by a laser or a puncher, the via hole is filled with a conductive paste such as copper or argentum to form an electrode. Then, an internal pattern is designed through a screen printing method.

Figure 1E:
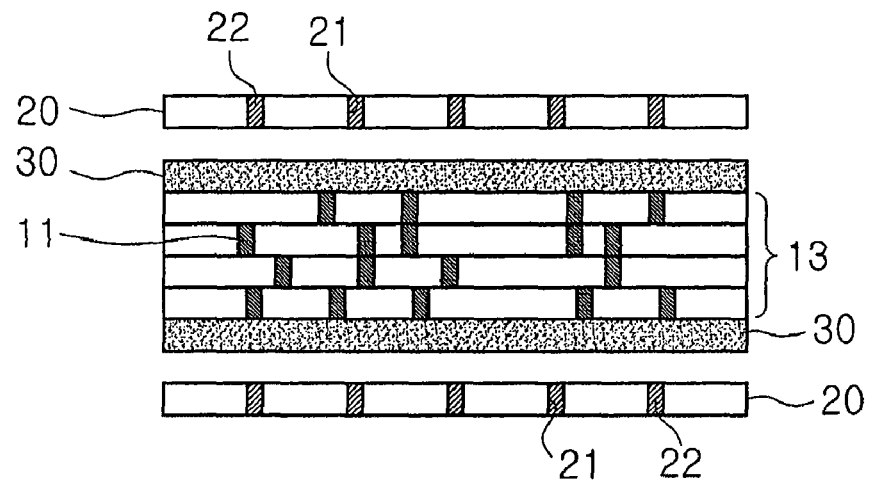

Referring to FIG. 1E, the plurality of ceramic laminated sheets 12 are laminated on each other to form the ceramic laminated body 13.

Also, a glass 30 is laminated on the top surface or undersurface of the ceramic laminated body 13. The glass 30 may be formed of a material, which may be sintered at a temperature substantially identical to or lower than the sintering temperature of the ceramic laminated body 13.

The glass 30 serves to adhere the ceramic laminated body 13 and the high temperature ceramic substrate 20 to each other while the ceramic laminated body 13 becomes the low temperature ceramic substrate through a low temperature firing process.

The ceramic laminated sheet 12 may be pressed at a predetermined pressure to be the ceramic laminated body 13. However, the pressure process may be performed at some later time.

Figure 1F:
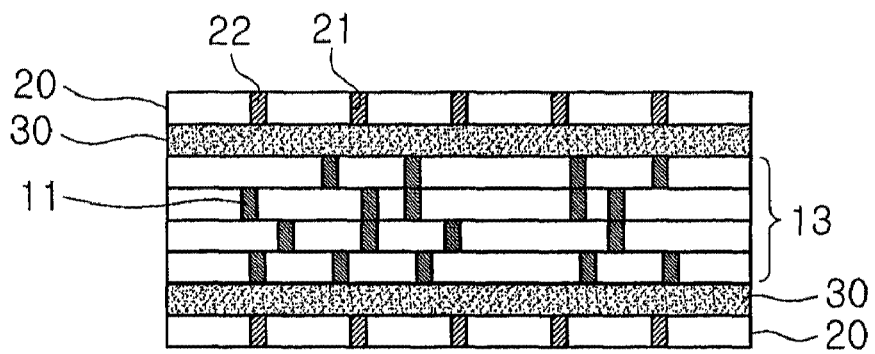

Referring to FIG. 1F, the ceramic substrate according to an embodiment of the present invention may be formed by laminating the high temperature ceramic substrate 20 on the glass 30 laminated on the ceramic laminated body 13.

In this case, the high temperature ceramic substrate 20 serves as a constraint body. That is, when the ceramic laminated body 13 becomes the low temperature ceramic substrate through the firing process, the high temperature ceramic substrate 20 serves as a constraint body without requiring any other constraint body to apply a non-shrinkage method.

Generally, when the low temperature ceramic substrate is manufactured through the non-shrinkage method, a separate constraint body is laminated, and removed after the low temperature firing. However, the method of manufacturing the ceramic substrate according to an embodiment of the present invention does not require the separate constraint body. Accordingly, there is no inconvenience caused by the lamination and removal of the constraint body.

As described in FIG. 1F, the ceramic laminated body 13, the glass 30, and the high temperature ceramic substrate 20 may be pressed at a predetermined pressure to be united into one body to a certain extent.

On the other hand, when the ceramic laminated body 13, the glass 30, and the high temperature ceramic substrate 20 are fired at a low temperature, only the ceramic laminated 13 and the glass 30 are fired without a significant firing effect on the high temperature ceramic substrate 20. This is because the high temperature ceramic substrate 20 has already been fired at a high temperature.

Figure 1G:
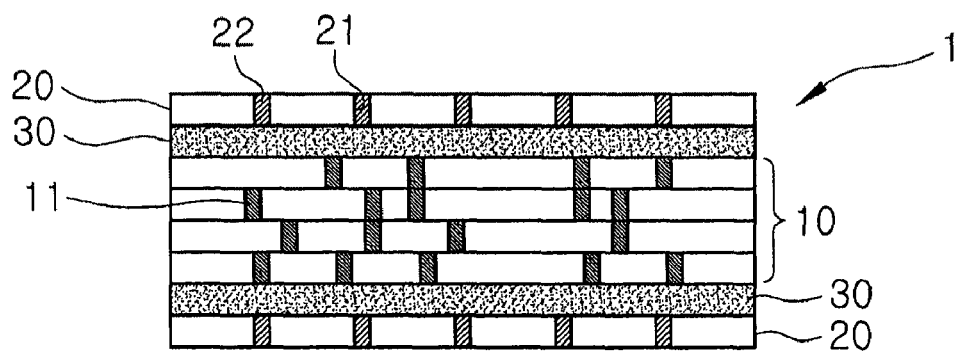

FIG. 1G illustrates a ceramic substrate completed through the above firing processes.

After the ceramic laminated body 13, the glass 30 and the high temperature ceramic substrate 20 are fired at a low temperature of about 1000° C. or less, the ceramic laminated body 13 becomes the low temperature ceramic substrate 10, and the glass 30 is combined with the high temperature ceramic substrate 20 and the low temperature ceramic substrate 10 through interfacial reaction.

Through the firing process, the glass 30 may begin to be fired at a somewhat lower temperature than the ceramic laminated body 13. Accordingly, when the ceramic laminated body 13 is fired, the glass 30 provides interfacial adhesions by the interfacial reaction with the high temperature ceramic substrate 20 and the ceramic laminated body 13.

The glass 30, which begins to be fired at a lower temperature than the firing temperature of the ceramic laminated body 13, may include $B_2O_3$, $SiO_2$, etc.

If the glass 30 is fired at a low temperature after laminated on the high temperature ceramic substrate 20 and the ceramic laminated body 13, the glass 30 may buff or prevent a separation or a crack caused by a low adhesion at an interface between the high temperature ceramic substrate 20 and the ceramic laminated body 13.

Referring to FIG. 1G, the ceramic substrate 1 manufactured by the above process is divided into the high temperature ceramic substrate 20, the low temperature ceramic substrate 10, and the glass 30 disposed therebetween.

Accordingly, when the ceramic substrate 1 is used in a device for a chemical process, the high temperature ceramic substrate 20 may be allowed to be exposed to an environment requiring a high chemical resistance due to strong chemical resistance and mechanical strength of the high temperature ceramic substrate 20.

Although in such an environment, the excellent electrical properties of the low temperature ceramic substrate 10 are usable (an electrode substantially identical to that of the low temperature ceramic substrate 10 may be prepared in the high temperature ceramic substrate 20). Also, multi-layer or precise pattern may be embodied in the low temperature ceramic substrate 10.

Brittleness of the high temperature ceramic substrate 20 may be improved due to its strong mechanical strength. Accordingly, a strong substrate endurable to an external shock can be manufactured.

A ceramic substrate and a method of manufacturing the same according to another embodiment of the present invention will be described with reference to FIG. 2.

FIGS. 2A to 2F illustrate a method of manufacturing a ceramic substrate by adhering an already-fired high temperature ceramic substrate and an already-fired low temperature ceramic substrate to each other.

Figure 2A:
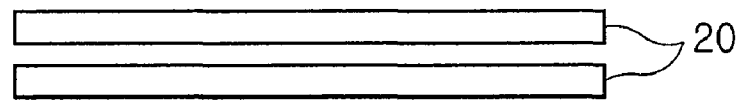
FIG. 2A through FIG. 2F are a diagram illustrating a ceramic substrate and a method of manufacturing the same according to another embodiment of the present invention.

Referring to FIG. 2A, a high temperature ceramic substrate 20 is prepared. The high temperature ceramic substrate 20 is an already-high temperature fired substrate. The high temperature ceramic substrate 20 may be provided through a typical HTCC process. Detail description of the process will be omitted since it has already been described above.

Figure 2B:

Referring to FIG. 2B, a via hole 21 is formed in the high temperature ceramic substrate 20 by a laser, etc.

Figure 2C:
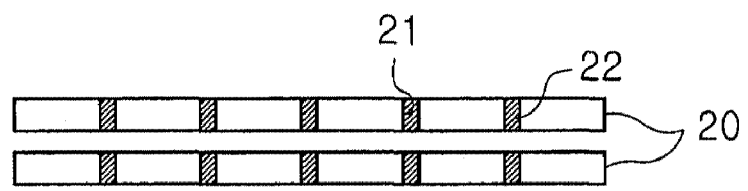

Referring to of FIG. 2C, a second electrode 22 is formed by filling the via hole 21 with a conductive paste.

The second electrode 22 may be identical to or different from a first electrode 11 of a low temperature ceramic substrate, which is substantially identical to the embodiment as described in FIG. 1. Accordingly, description thereof will be omitted herein.

Figure 2D:
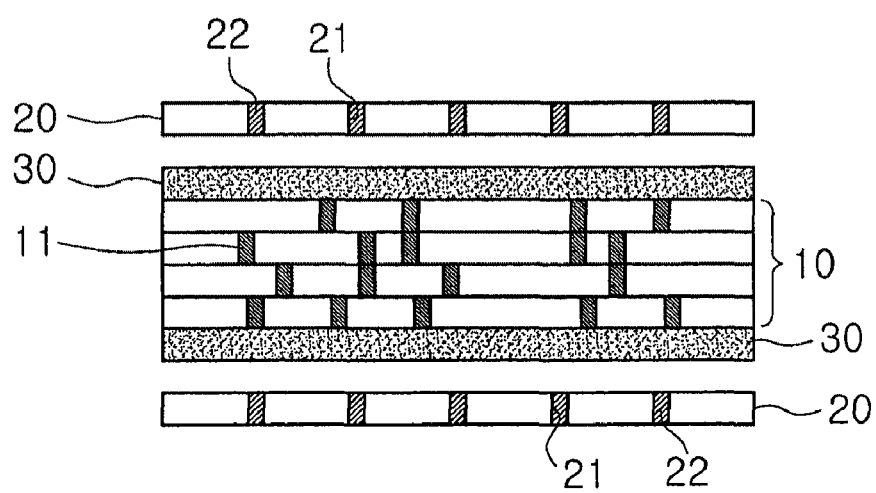

Referring to FIG. 2D, a low temperature ceramic substrate 10 is prepared, which may be a substrate manufactured by a typical LTCC method.

For example, via holes are formed in a plurality of ceramic laminated sheets. Then, the via hole is filled with a conductive paste to form an electrode. The ceramic laminated sheets are laminated on each other. A certain constraint body is laminated on the ceramic laminated sheets. And then, the ceramic laminated body is pressed at a predetermined pressure, and is fired at a low temperature. Finally, the low temperature ceramic substrate 10 may be obtained by removing the constraint body.

As described in FIG. 2D, a glass 30 is laminated on the top surface or undersurface of the low temperature ceramic substrate 10.

Figure 2E:
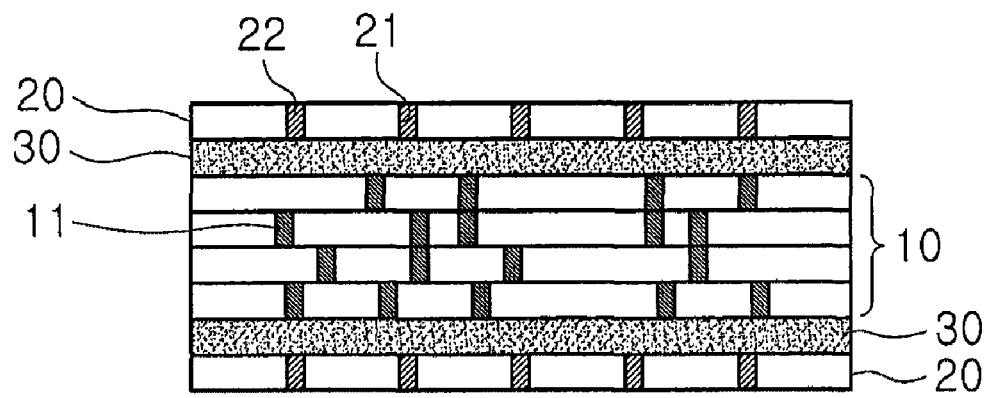
Figure 2F:
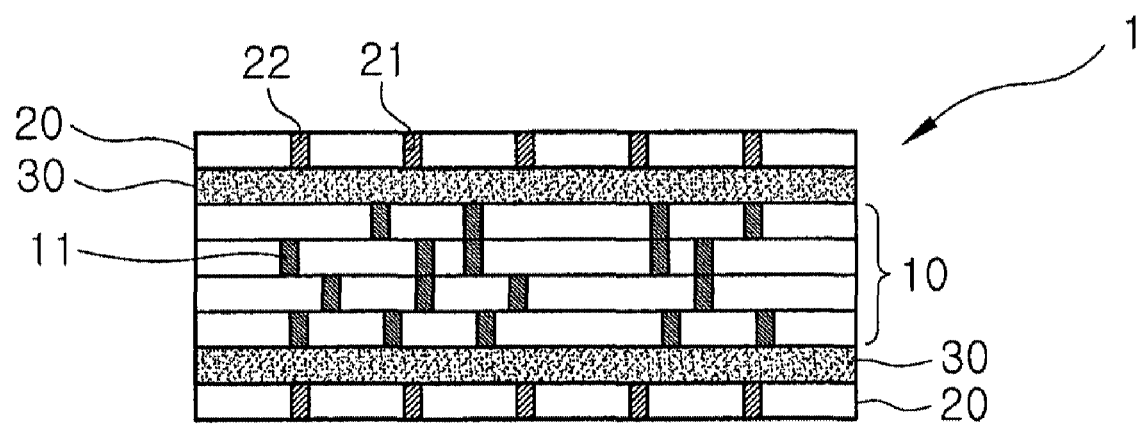

Referring to FIG. 2E, after a glass 30 is laminated on the low temperature ceramic substrate 10, the high temperature ceramic substrate 20 is laminated on the glass 30. In order to enhance adhesion between them, the low temperature ceramic substrate 10, the glass 30, and the high temperature ceramic substrate 20 may be pressed at a predetermined pressure.

Then, the low temperature ceramic substrate 10, the glass 30, and the high temperature ceramic substrate 20 are fired at a low temperature.

In this case, because the high temperature ceramic substrate 30 and the low temperature ceramic substrate 10 have already been fired, the high temperature ceramic substrate 30 and the low temperature ceramic substrate 10 are not significantly influenced by the low temperature firing. On the other hand, the glass 30 and the second electrode 22 of the high temperature ceramic substrate 30 are influenced by the low temperature firing.

The glass 30 provides interfacial adhesions by the interfacial reaction with the low temperature ceramic substrate 10 and the high temperature ceramic substrate 30 so as to combine the low and high ceramic substrates 10 and 30 into one ceramic substrate 1.

The ceramic substrate 1 according to this embodiment may include a part of the high temperature ceramic substrate 20 having strong chemical resistance and mechanical strength, and a part of the low temperature ceramic substrate 10. Accordingly, the ceramic substrate 1 may realize a device capable of performing tasks requiring high electrical properties and precision under an environment requiring high chemical resistance and mechanical strength.

An electrical device employing a ceramic substrate according to an embodiment of the present invention will be described with reference to FIG. 3. A probe card 50 is described as an example of the electrical device in FIG. 3.

Figure 3:
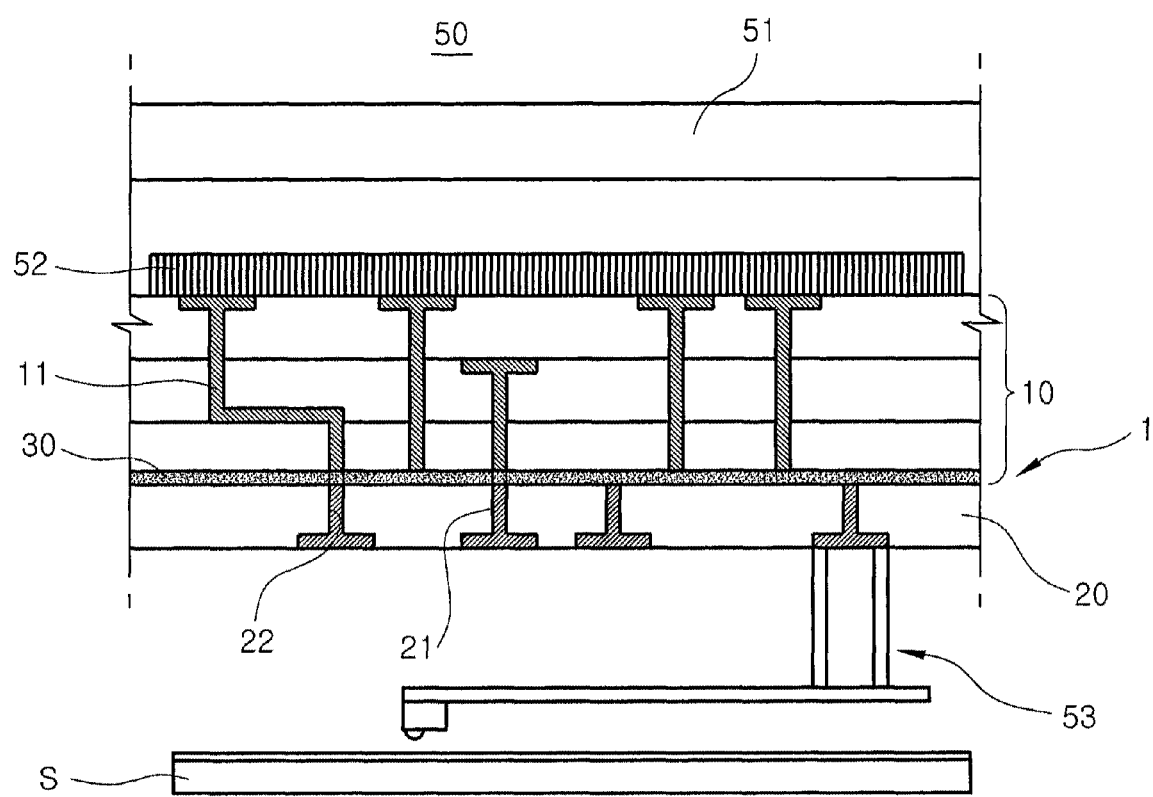
FIG. 3 is a diagram illustrating an electrical device according to an embodiment of the present invention.

FIG. 3 illustrates a part of the probe card 50. The probe card 50 may include a PCB 51 mounted with predetermined components, a ceramic substrate 1 connected to the PCB 51, and a probe 53 provided on the ceramic substrate 1.

The ceramic substrate 1 and the PCB 51 are electrically connected to a connector 52. Also, a silicon wafer S is shown in FIG. 3.

When each chip of the silicon wafer is probed using the probe card 50, an etching process is required. During the etching process, strong chemical resistance is required due to a long-time exposure to strongly acidic hydrogen fluoride (HF) solution or strongly alkaline potassium hydroxide (KOH) solution.

As described in FIG. 3, the ceramic substrate 1 used in the electrical device according to an embodiment of the present invention allows the high temperature ceramic substrate 30 to be exposed to the silicon wafer S, and allows the low temperature ceramic substrate 10 to be positioned therein. Accordingly, chemical resistance as well as electrical properties can be improved.

Detail description of the glass 30, a first electrode 11 of the low temperature ceramic substrate 10, and a second electrode 22 of the high temperature ceramic substrate 20 will be omitted because it has already been described in FIGS. 1 and 2.

The ceramic substrate and method of manufacturing the same according to the exemplary embodiments has excellent electrical properties, and chemical resistance and strength, and can be embodied as a multi-layer structure and a precise pattern. Accordingly, it is possible to manufacture a high-reliability substrate through a non-shrinkage process without any constraint body.

While the present invention has been shown and described in connection with the exemplary embodiments, it will be apparent to those skilled in the art that modifications and variations can be made without departing from the spirit and scope of the invention as defined by the appended claims.

What is claimed is:

1. A ceramic substrate comprising:
   a first laminated body having a predetermined electrode formed therein;
   a second laminated body laminated on and electrically connected to the first laminated body; and
   an adhesive part intervened between the first laminated body and the second laminated body to adhere the first and second laminated bodies through interfacial reaction.

2. The ceramic substrate of claim 1, wherein the second laminated body comprises a high temperature co-fired ceramic substrate.

3. The ceramic substrate of claim 2, wherein the first laminated body comprises a low temperature co-fired ceramic substrate formed from a predetermined ceramic laminated body through a low temperature firing together with the high temperature co-fired ceramic substrate.

4. The ceramic substrate of claim 3, wherein the adhesive part comprises a glass intervened between the ceramic laminated body and the high temperature co-fired ceramic substrate to provide a predetermined adhesion through the low temperature firing.

5. The ceramic substrate of claim 3, wherein the high temperature co-fired ceramic substrate comprises a plurality of holes, the plurality of holes being filled with an electrode material identical to an electrode material of the low temperature co-fired ceramic substrate to form an electrode, and being fired together with the ceramic laminated body.

6. The ceramic substrate of claim 2, wherein the first laminated body comprises an already-fired low temperature co-fired ceramic substrate.

7. The ceramic substrate of claim 6, wherein the adhesive part comprises a glass intervened between the high ceramic co-fired ceramic substrate and the low temper co-fired ceramic substrate to provide adhesion through a low-temperature firing.

8. The ceramic substrate of claim 6, wherein the high temperature co-fired ceramic substrate comprises a plurality of holes, the plurality of holes being filled with a predetermined material to form an electrode.

9. The ceramic substrate of claim 8, wherein the electrode formed in the high temperature co-fired ceramic substrate is identical to the electrode formed in the low temperature co-fired ceramic substrate.

10. An electrical device comprising:
    a low temperature co-fired ceramic substrate having a predetermined electrode formed therein;
    a high temperature co-fire ceramic substrate provided on the outside of the low temperature co-fired ceramic substrate;
    an adhesive part intervened between the first laminated body and the second laminated body to adhere the first and second laminated bodies through interfacial reaction; and
    a working device provided on the high temperature co-fired ceramic substrate to perform a predetermined task.

11. The electrical device of claim 10, wherein the working device comprises a probe device probing each chip in a silicon wafer to test the silicon wafer.

* * * * *